United States Patent [19]
Burkhart et al.

[11] Patent Number: 6,075,375
[45] Date of Patent: *Jun. 13, 2000

[54] APPARATUS FOR WAFER DETECTION

[75] Inventors: Vincent E. Burkhart, San Jose, Calif.; Deepak Manaoharlal, Chamrajpet Bangalore, Ind.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/873,268

[22] Filed: Jun. 11, 1997

[51] Int. Cl.⁷ .................................................. H02N 13/00
[52] U.S. Cl. ........................ 324/758; 324/662; 324/756; 361/234
[58] Field of Search ............................ 361/234; 324/758, 324/662, 754, 756

[56] References Cited

U.S. PATENT DOCUMENTS

| | | |
|---|---|---|
| 4,158,171 | 6/1979 | Abbe et al. . |
| 4,409,087 | 10/1983 | Quick . |
| 4,923,584 | 5/1990 | Bramhall, Jr. et al. . |
| 4,944,860 | 7/1990 | Bramhall, Jr. et al. . |
| 4,952,299 | 8/1990 | Chrisos et al. . |
| 5,103,367 | 4/1992 | Horowitz et al. . |
| 5,325,261 | 6/1994 | Horwitz . |
| 5,378,994 | 1/1995 | Novak et al. . |
| 5,436,790 | 7/1995 | Blake et al. . |
| 5,444,597 | 8/1995 | Blake et al. . |
| 5,491,423 | 2/1996 | Turetta . |
| 5,539,323 | 7/1996 | Davis, Jr. . |
| 5,606,251 | 2/1997 | Ryle et al. . |
| 5,642,056 | 6/1997 | Nakajima ........................ 324/758 |
| 5,670,066 | 9/1997 | Barnes et al. . |

FOREIGN PATENT DOCUMENTS

| | | |
|---|---|---|
| 2 676 603 | 11/1992 | France . |
| WO88/09054 | 11/1988 | WIPO . |

*Primary Examiner*—Josie Ballato
*Assistant Examiner*—Jose M. Solis
*Attorney, Agent, or Firm*—Thomason, Moser & Patterson

[57] ABSTRACT

An apparatus and a method for detecting the presence and position of a wafer upon a semiconductor wafer support pedestal surface. Specifically, a wafer detector comprising a plurality of electrodes on a surface of the wafer support pedestal. The electrodes are coupled to a capacitance measurement circuit that measures the capacitance between the electrodes and generates a signal corresponding to a wafer's presence, location and chucking condition. The wafer's presence completes an electrical circuit between the electrodes, increasing the capacitance between the electrodes. As such, the presence of a wafer, the position of the wafer, and the condition of the wafer, i.e., wafer damage, can be detected upon a wafer support pedestal during wafer processing.

15 Claims, 6 Drawing Sheets

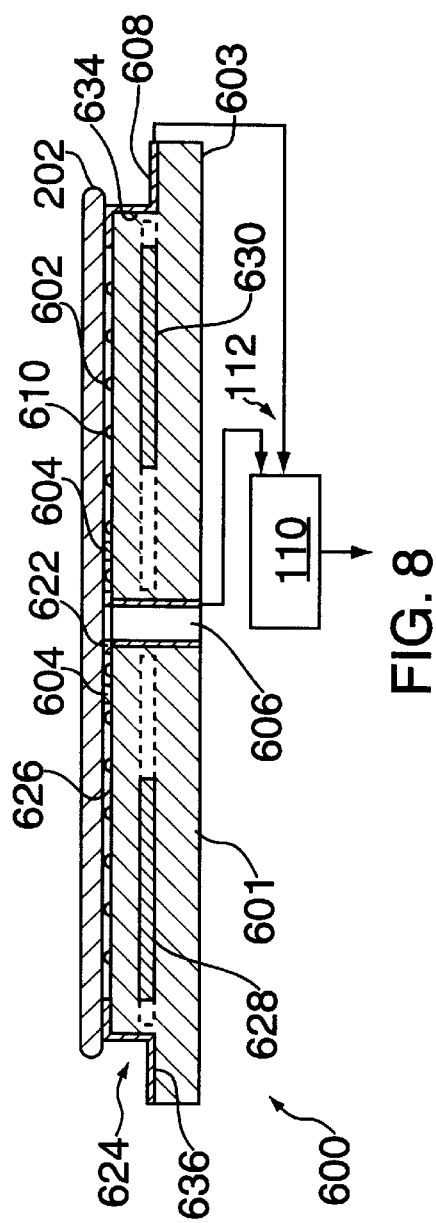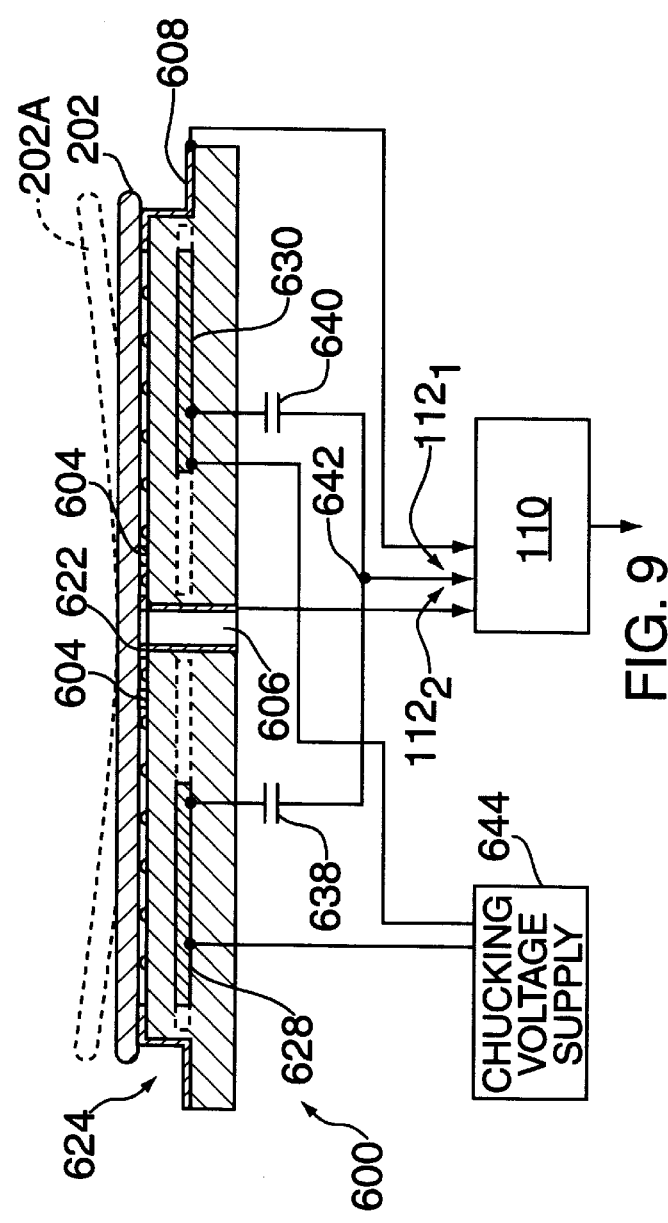

APPARATUS FOR WAFER DETECTION

BACKGROUND OF THE DISCLOSURE

1. Field of the Invention

The invention generally relates to a wafer support pedestal of a semiconductor wafer processing system. More particularly, the invention relates to an apparatus and a method for detecting the presence and position of a semiconductor wafer upon a wafer support pedestal.

2. Description of the Background Art

Semiconductor wafer processing equipment generally contains a vacuum chamber having a wafer support pedestal positioned within the vacuum chamber to support a wafer within the chamber atmosphere during processing. The pedestal generally contains a mechanism for retaining the wafer upon the pedestal surface. Such wafer retainers include mechanical clamps which physically retain the edge of the wafer and press the wafer against the pedestal surface, vacuum chucks that retain the wafer by establishing a vacuum beneath the wafer relative to the chamber pressure and electrostatic chucks that electrostatically retain the wafer in a stationary position upon the surface of the pedestal.

No matter what form of chuck is used to retain the wafer, it is important to determine when a semiconductor wafer has been positioned upon the pedestal and whether the wafer has been chucked (clamped) prior to processing the wafer. U.S. Pat. No. 5,436,790 issued Jul. 25, 1995 discloses a wafer presence and clamp condition monitoring apparatus. In this apparatus, a circuit monitors capacitance between two electrodes embedded within a wafer support pedestal. The capacitance falls into one range with no wafer positioned upon the support surface and into a second range with a wafer in place but not clamped. Furthermore, the capacitance falls in a third range with the wafer held in place by an electrostatic chuck formed when the embedded pair of electrodes are energized with a DC voltage. The monitoring circuit senses when the capacitance of the system is in each of the ranges by converting the measured capacitance to a DC voltage that can easily be sensed and used to confirm wafer placement and clamping.

Specifically, the electrostatic chuck used in the prior art system contains a pliable surface such that when the clamping force is applied, the wafer compresses the surface material and the wafer physically moves nearer to the pedestal surface and its embedded electrodes. This physical movement of the wafer relative to the electrodes causes a change in the capacitance between the electrodes. Such pliable surface materials are only useful in low temperature semiconductor processing systems. At high temperatures, these materials breakdown, outgas and/or deform. As such, at high temperatures, the electrostatic chuck having a pliable surface would contaminate the chamber.

Ceramic electrostatic chucks that are typically used in high temperature semiconductor wafer processing are constructed of a ceramic material that becomes somewhat conductive at high temperatures (i.e., the resistivity of the material decreases with increased temperature). Specifically, when the wafer rests flush against the surface of the chuck body while chucking voltage is applied one or more embedded electrodes, the wafer is primarily retained against the ceramic support by the Johnsen-Rahbek effect. One example of such a ceramic chuck is disclosed in U.S. Pat. No. 5,117,121 issued May 26, 1992 and incorporated herein by reference.

Ceramic chucks of this type have a hard, non-pliable surface that does not break down or deform during high temperature wafer processing. As such, the capacitive wafer position monitoring systems such as that described above have not heretofore been used in conjunction with these chucks because the surface is not pliable to allow the wafer to move substantially closer to the electrodes when chucked.

Therefore, a need exists in the art for a system that detects wafer presence and operates at high wafer processing temperatures.

SUMMARY OF THE INVENTION

The disadvantages heretofore associated with the prior art are overcome by the present invention of an apparatus and method for detecting the presence of a wafer as the wafer is positioned upon a non-pliable surface of a high-temperature semiconductor wafer support pedestal, e.g., a ceramic electrostatic chuck. The invention also detects whether a wafer positioned on the support surface has been damaged, whether the wafer has been chucked and whether a wafer has a positive or negative bow.

The first embodiment of the invention contains a plurality of electrodes affixed to the surface of the wafer support pedestal and arranged such that all the electrodes are covered by a wafer that is properly centered upon the pedestal surface. Specifically, the electrodes are arranged in three pairs, where each of the pairs is equilaterally positioned proximate the edge of the pedestal surface. The electrodes are coupled to a capacitance measurement circuit that measures the capacitance between the electrodes of each pair and generates a signal corresponding to a wafer's presence, location and chucking condition. Wafer presence increases the capacitance between the electrodes by providing substantial capacitive coupling between the electrodes. Increasing chucking force also increases capacitance by decreasing the gap between the wafer and the chuck surface. This gap capacitance can be utilized to detect wafer sticking after dechucking or to adjust a chucking voltage to obtain a pre-determined chucking force.

In a second embodiment of the invention, a plurality of electrodes are unpaired and spaced equilaterally about the circumference of the wafer support pedestal (e.g., three surface electrodes). A common electrode (e.g., a fourth surface electrode) is positioned near a center of the wafer support pedestal. The presence of the wafer on the support surface completes a conductive path between the electrodes, i.e., the wafer contacts all four of the surface electrodes. Any damage to the wafer, such as cracks in the wafer, a broken wafer, and the like, will interrupt the conductive path or paths. As such, the second embodiment of the invention enables damaged wafers to be detected as well as detect wafer presence. Furthermore, if the wafer is not centered on the pedestal surface and one of the electrodes is not covered by the wafer, the conductive path is not complete with respect to that electrode. As such, the invention can detect when a wafer is improperly positioned on the support surface.

A third embodiment of the invention comprises a plurality of surface edge electrodes disposed about the circumference of a chuck surface. These electrodes, which are interconnected with one another, form an outer surface electrode. A circumferential conductor that is deposited upon a vertical, circumferential edge of a support region of the chuck provides the interconnection amongst all the edge electrodes to form a single, unified outer surface electrode. An inner surface electrode is disposed proximate the center of the wafer support surface of the chuck. In a simple form, the capacitance between the inner and outer surface electrodes is measured to identify the presence of a wafer, whether the wafer is chucked, and whether the wafer is centered in much the same manner as the capacitance is measured between the electrodes of the second embodiment of the invention.

However, to promote additional measurement accuracy and flexibility, the capacitance is preferably measured between an embedded electrode or electrodes of the electrostatic chuck and the inner and outer surface electrodes, respectively. As such, wafer presence, position, and chucking condition is determined through these capacitance measurements. Additionally, the wafer bow orientation is also determined when the wafer is first positioned upon the chuck support surface. For example, when a negatively bowed wafer is placed upon the chuck surface, the wafer contacts the inner surface electrode, but not the outer surface electrode. As such the capacitance measured between the inner surface electrode and the embedded electrode(s) is much higher than the capacitance measured between the outer surface electrode and the embedded electrode (i.e., for a wafer having a negative bow, the inner electrode contacts the wafer and the outer electrode does not contact the wafer). The opposite capacitance measurement is found when the wafer is positively bowed (i.e., for a wafer having a positive bow, the inner electrode does not contact the wafer and the outer electrode does contact the wafer). Thereafter, the chucking voltage can be incrementally applied to the embedded electrodes until the wafer contacts both electrodes, indicating a "chucked" condition.

As a result of using the present invention, the presence of a wafer, the position of the wafer, the direction of wafer bow, and the condition of the wafer, i.e., wafer damage, can be detected upon a wafer support pedestal during wafer processing. Furthermore, the invention can be used in conjunction with any non-pliable pedestal surface.

BRIEF DESCRIPTION OF THE DRAWINGS

The teachings of the present invention can be readily understood by considering the following detailed description in conjunction with the accompanying drawings, in which:

FIG. 8 depicts a cross-sectional view taken along line 8—8 of FIG. 7 of the present invention used in conjunction with a wafer spacing mask; and FIG. 9 depicts a cross-sectional view taken along line 8—8 of FIG. 7 of the present invention used in conjunction with a wafer spacing mask and electrodes embedded in a pedestal.

To facilitate understanding, identical reference numerals have been used, where possible, to designate identical elements that are common to the figures.

DETAILED DESCRIPTION

Figure 1:
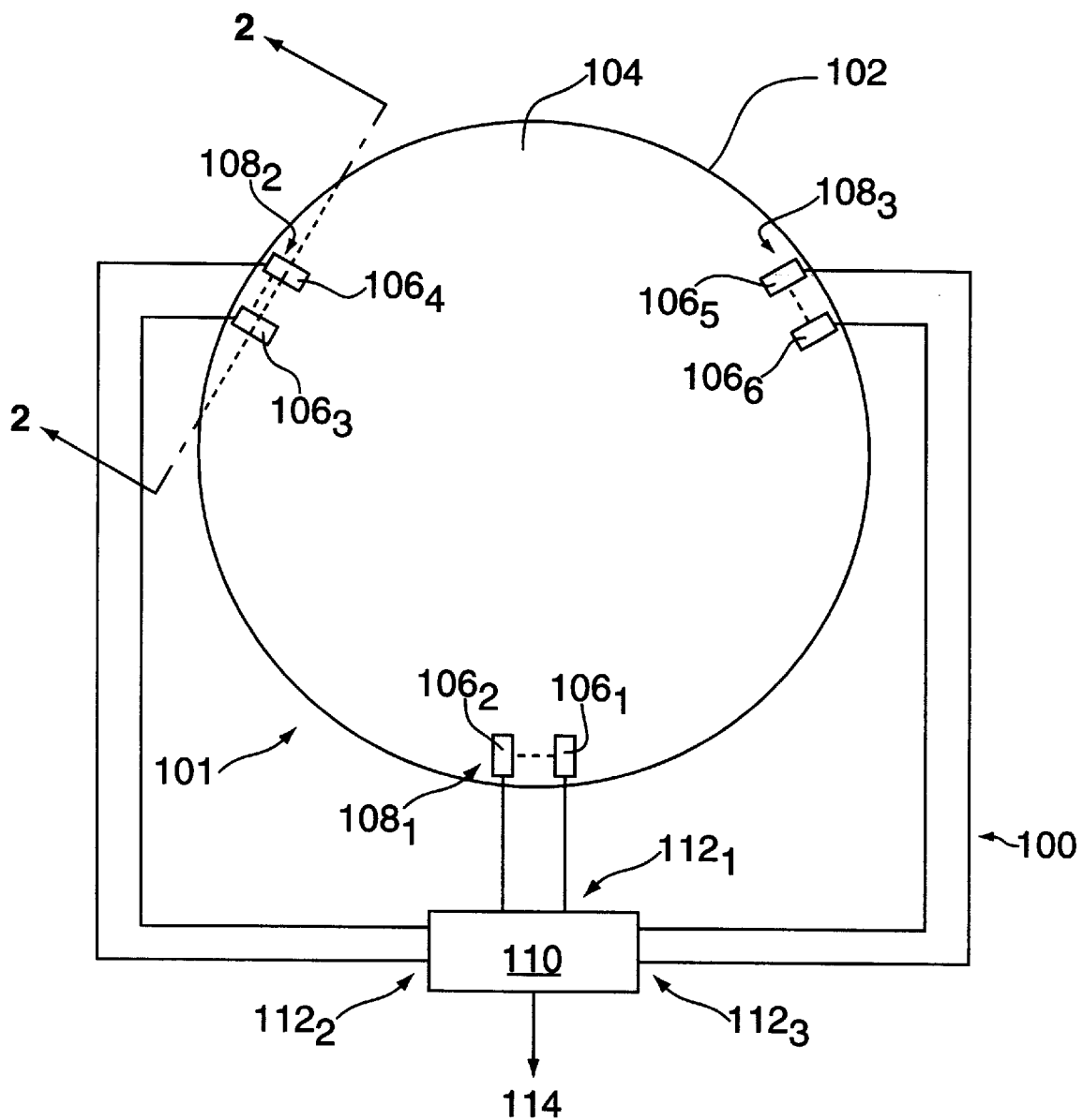
FIG. 1 depicts a top plan view of a first embodiment of the present invention.

FIG. 1 depicts a wafer detection system 100 in accordance with the present invention. The system 100 contains a plurality of electrodes $106_1$–$106_6$ affixed to a surface 104 of a wafer support pedestal 102 and a capacitance measurement circuit 110. To form an electrostatic chuck 101, the wafer support pedestal 102 contains one or more electrodes (not shown) embedded beneath its surface. Preferably, the electrostatic chuck 101 is a ceramic chuck capable of withstanding high temperature wafer processing. The ceramic chuck is, for example, fabricated of aluminum-nitride or boron-nitride or alumina doped with a metal oxide such as titanium-oxide ($TiO_2$) or chromium-oxide, or some other ceramic material with similar resistive properties. Such a partially conductive ceramic material (i.e., a material having relatively low resistivity at high temperatures) promotes the Johnsen-Rahbek effect that electrostatically retains a semiconductor wafer during high-temperature processing of the wafer. An illustrative ceramic electrostatic chuck is disclosed in commonly assigned U.S. Pat. No. 5,511,799 issued Apr. 30, 1996, herein incorporated by reference. Examples of non-ceramic electrostatic chucks that may be used in conjunction with the invention are disclosed in U.S. Pat. No. 4,184,188 issued Jan. 15, 1980 and U.S. Pat. No. 4,384,918 issued May 24, 1983, both of which are incorporated herein by reference. Also, low temperature (e.g., for semiconductor processing less than 300° C.) chucks include electrostatic chucks and mechanical clamping chucks which contain wafer support surfaces that are typically fabricated from dielectric materials such as alumina. Although the preferred embodiment of the present invention is discussed as used in conjunction with a ceramic electrostatic chuck, the invention is also useful for wafer detection above any form of chuck, including ceramic electrostatic chucks, mechanical chucks, vacuum chucks and the like, at any temperature.

The electrodes $106_1$–$106_6$ are typically a metal such as titanium or titanium-nitride that are deposited upon the surface of the wafer support pedestal using physical wafer deposition (PVD), chemical vapor deposition (CVD) or other metal deposition processes. More specifically, the electrodes are fabricated by placing a metal mask or stencil on the surface 104 of the wafer support pedestal 102 and depositing a conductive material upon the stencil and pedestal. The stencil ensures that the electrodes are deposited in pre-defined positions on the surface of the wafer support pedestal. As such, when the stencil is removed, the electrodes remain affixed to the surface in a predefined pattern having a uniform height of approximately 1.5 to 3 $\mu$m. The conductive material choice is based upon the operating processing temperatures, the material from which the wafer support pedestal is constructed and compatibility with the wafer process.

In the first embodiment of the present invention, the plurality of electrodes $106_1$–$106_6$ is arranged in electrode pairs $108_1$, $108_2$, $108_3$, forming a plurality of electrode pairs. Each electrode in each pair is spaced apart by approximately 1 to 5 mm. The electrode pairs are positioned equilaterally about the circumference of the surface 104 of the wafer support pedestal 102. Each pair of electrodes $108_1$, $108_2$, $108_3$ is coupled to input terminals $112_1$, $112_2$, $112_3$, respectively, of a capacitance measurement circuit 110. The capacitance measurement circuit 110 measures a capacitance between each pair of electrodes. This capacitance changes depending upon whether a wafer is present, i.e., whether a wafer is positioned upon the pedestal surface and covering a pair of electrodes. As such, if the wafer is off center and not covering an electrode pair, the circuit 110 measures a substantial difference in capacitance of the electrode pairs and deems the wafer to be off center at output 114.

Figure 2:
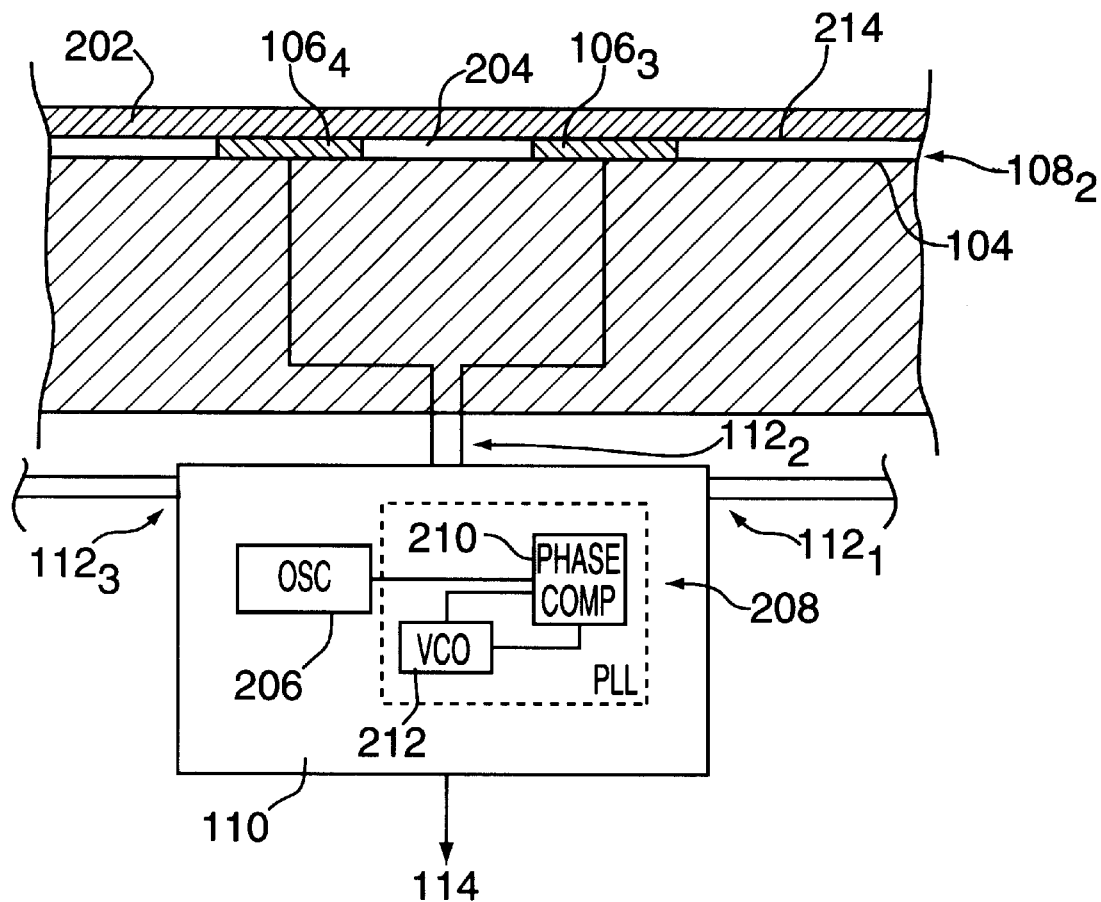
FIG. 2 depicts cross-sectional view of a pair of electrodes used in the first embodiment of the present invention taken along line 2—2 of FIG. 1 and depicts a block diagram of an illustrative capacitance measurement circuit.

FIG. 2 depicts a cross-sectional view of a pair of electrodes $108_2$ used in the first embodiment of the present invention taken along line 2—2 of FIG. 1, with a wafer 202 placed on the pair of electrodes $108_2$. When at least one, but less then all, of the pair of electrodes detect a wafer presence, the wafer is not centered. Accordingly, the wafer can be properly centered prior to processing. When the wafer is centered, all pairs of electrodes detect a wafer presence, i.e., each electrode pair has a substantial change in capacitance. Such a wafer centering detection function is useful in protecting the wafer pedestal from exposure to the chamber atmosphere. For example, in a PVD system, when the wafer is not properly centered upon the pedestal, the target material is deposited upon the pedestal, destroying the pedestal. The invention is used to provide a fail-safe function that will interrupt the deposition process if a wafer is not properly centered upon the pedestal.

In the depicted embodiment, the capacitance measurement circuit 110 contains a simple square wave oscillator 206 such as a 555 timer integrated circuit and frequency-to-voltage converter 208, e.g., a phase lock loop (PLL). Each pair of electrodes $108_1$, $108_2$, $108_3$ forms a capacitive tuning element for an oscillator 206 such that the frequency at the output of the oscillator will change with the capacitance across the input terminals. The frequency output is coupled to the input of a frequency-to-voltage converter 208, e.g., a PLL having a voltage controlled oscillator (VCO) 212 and a phase comparator 210. As such, the converter 208 provides a DC voltage (i.e., the VCO control voltage) that is proportional to the capacitance of a pair of the electrodes 108. Each pair of electrodes has its own capacitance measuring circuit or a single circuit can be shared using an analog multiplexer to selectively connect each electrode pair to the circuit. The depicted measurement circuit 110 should be considered illustrative of all the circuits that can be used to perform the function of generating a signal indicative of the capacitance between the electrodes. The invention includes any circuit that performs this function.

In operation, as a wafer 202 is positioned upon the wafer support pedestal surface 104, the capacitance between each electrode $106_1$–$106_6$ in each pair of electrodes $108_1$, $108_2$, $108_3$ changes such that the presence of the wafer 202 can be detected at each electrode pair by detecting a change in capacitance. This capacitance value increases when the wafer is chucked as the vacuum gap 204 between the wafer and the electrodes $106_1$–$106_6$ becomes smaller. As such, the invention can also be used to determine the chucking condition of the wafer. Furthermore, if the wafer is not centered, the capacitance measured at each of the electrode pairs $108_1$, $108_2$, $108_3$ will be different. Consequently, the output 114 from the capacitance measurement circuit 110 is used for determining whether the wafer 202 is centered upon the wafer support pedestal as well as to indicate if the wafer is present and/or chucked.

Figure 3:
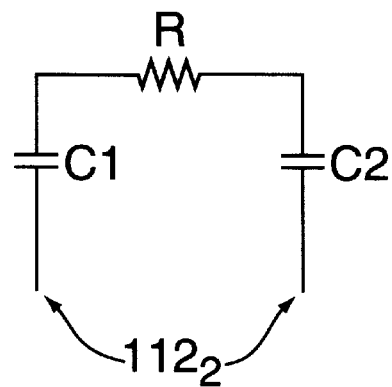
FIG. 3 depicts a representative electrical circuit of the pair of electrodes of FIG. 2.

FIG. 3 depicts a representative electrical circuit model of the electrode pair $108_2$ of FIG. 2. $C_1$ represents the capacitance from the electrode $106_4$ to the wafer backside surface 214, and $C_2$ represents the capacitance from the electrode $106_3$ to the wafer backside surface 214. R is the resistance of the backside surface 214. Generally, the resistance is insignificant and the total capacitance ($C_T$) measured at the respective input port $112_2$ is essentially $$C_T = \frac{1}{\frac{1}{C_1} + \frac{1}{C_2}}.$$

Figure 4:
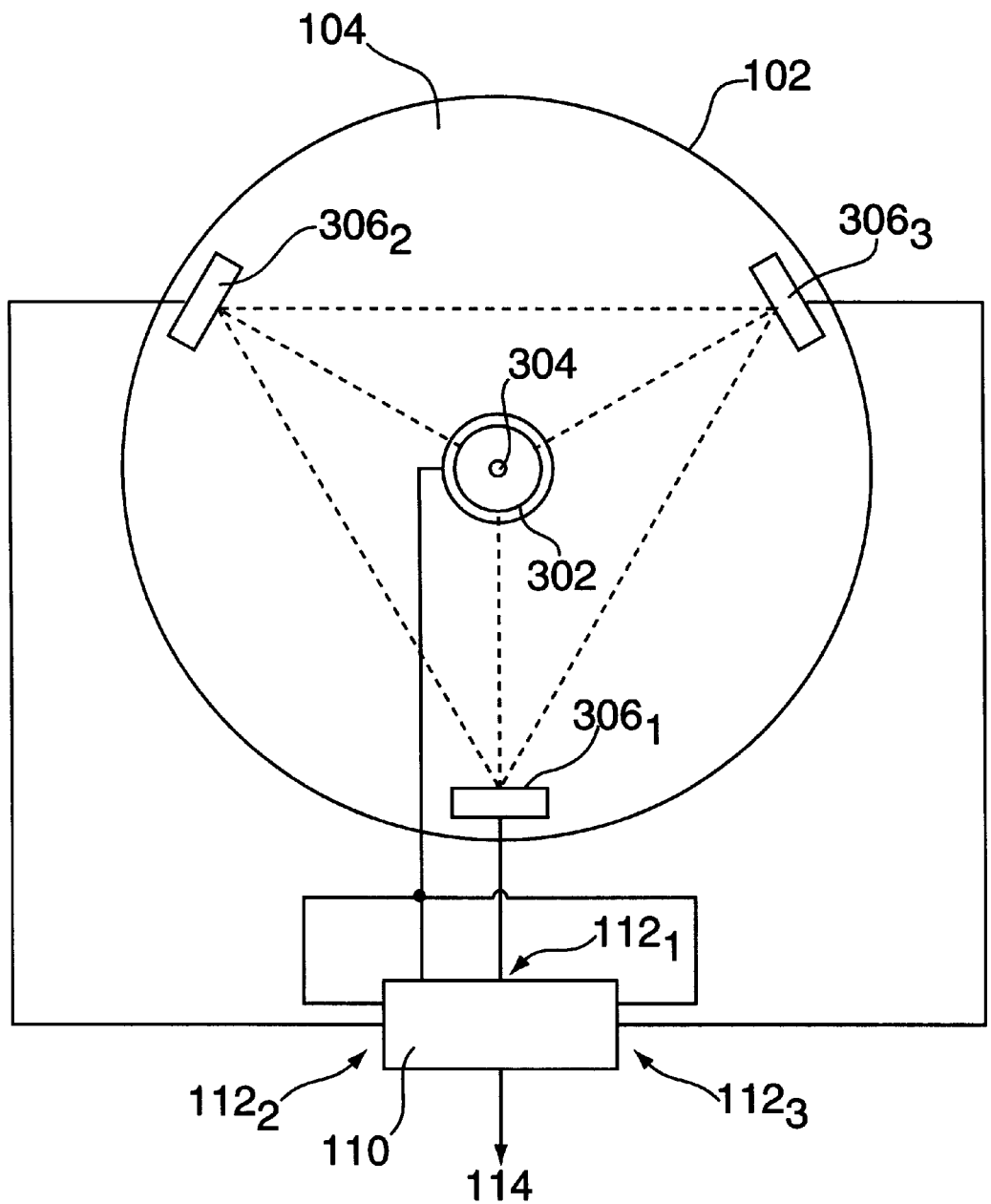
FIG. 4 depicts a top plan view of a second embodiment of the present invention.

FIG. 4 depicts a top plan view of a second embodiment of the invention that includes a plurality of individual electrodes $306_1$, $306_2$, $306_3$ spaced equilaterally about the surface 104 of the pedestal 102 and a common electrode 302 positioned in a center 304 of the surface 104 of the pedestal 102. Specifically, FIG. 4 depicts four surface electrodes, three outer electrodes $306_1$, $306_2$, $306_3$ spaced equilaterally about the circumference and an inner electrode 302 at the center of the pedestal surface 104. However, those skilled in the art could configure other electrode arrangements comprising any number of electrodes.

A capacitance measurement circuit 110 measures the capacitance between each of the three outer electrodes $306_1$, $306_2$, $306_3$ and the common inner electrode 302 in the same manner as discussed above. Specifically, each of the three electrodes $306_1$, $306_2$, $306_3$ and the common electrode 302 forms a capacitive tuning element for an oscillator in the circuit 110. The frequency at the output of the oscillator is typically converted to a DC voltage by a frequency-to-voltage converter. The DC voltage is indicative of the capacitance between each electrode pair.

The electrical circuit representation of this embodiment is the same as FIG. 3. The wafer 202 forms a conductive path R such that if the wafer is damaged, i.e., cracked or broken in some manner, the conductive path is broken between the electrodes, e.g., the path between outer electrode $306_1$ and inner electrode 302, the capacitance measurement will be incorrect, e.g., very low. Furthermore, as with the first embodiment of the invention, an off center wafer is detected by the difference in capacitance measured for each electrode pair and chucking condition is determined by measuring the change in magnitude of the capacitance of each pair of electrodes. As such, the second embodiment of the invention monitors the position of the wafer and the chucking condition as well as the physical condition of the wafer upon the pedestal.

Figure 5:
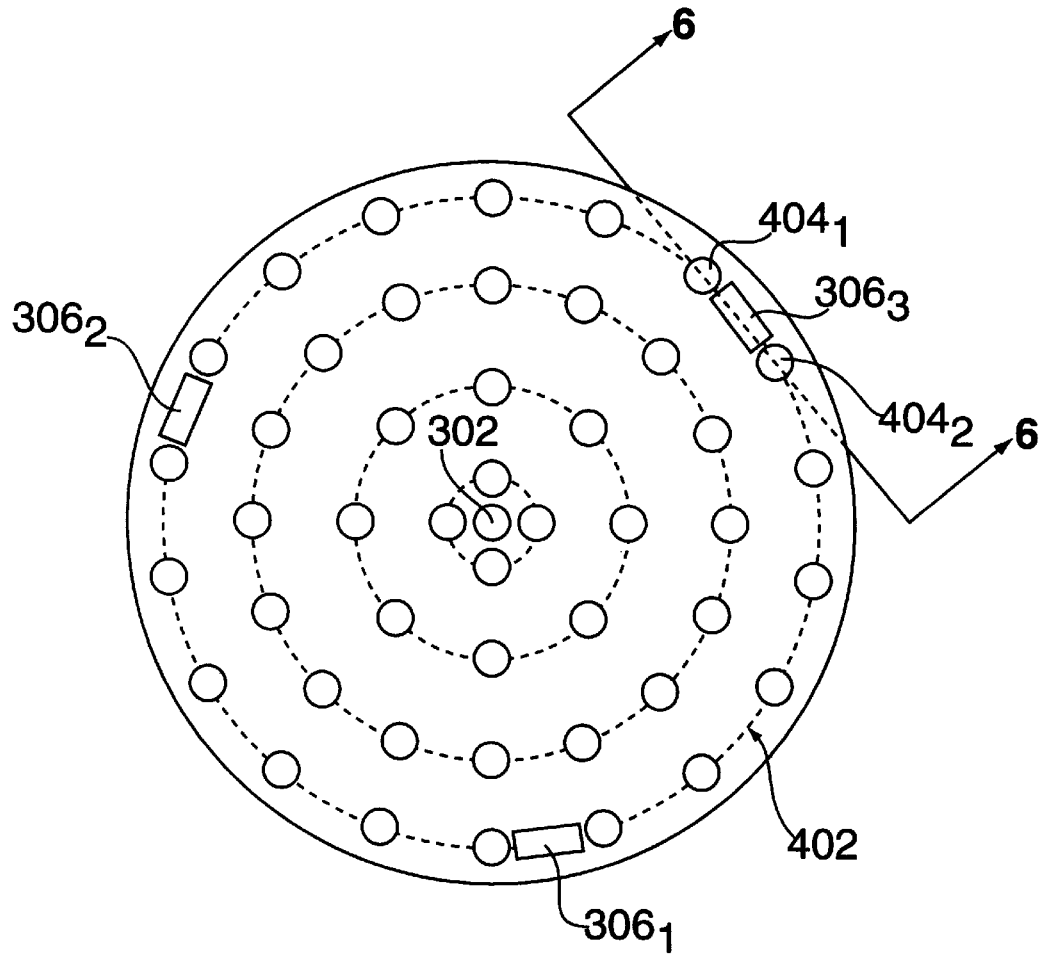
FIG. 5 depicts a top plan view of a ceramic electrostatic chuck having a wafer spacing mask in conjunction with the second embodiment of the present invention.
Figure 6:
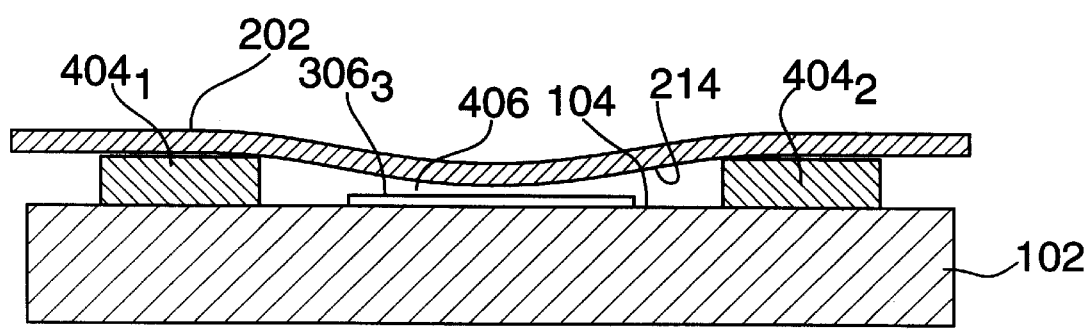
FIG. 6 depicts a detailed cross-sectional view taken along line 6—6 of FIG. 5 of an electrode structure used by the present invention in conjunction with a wafer spacing mask.

FIG. 5 depicts a top plan view of a ceramic electrostatic chuck containing a wafer spacing mask 402 and FIG. 6 depicts a cross-sectional view take along line 6—6 of FIG. 5. To best understand the use of the invention in conjunction with a wafer spacing mask, the reader should refer to both FIGS. 5 and 6. In many instances, a wafer spacing mask comprising a pattern of metallic or other material pads 404 are positioned upon the surface 104 of the wafer support pedestal 102. Such pads are used to reduce the amount of contaminants which are coupled from the chuck surface to a backside 214 of the wafer 202. Such a wafer spacing mask is disclosed in commonly assigned patent application Ser. No. 08/612,652 filed Mar. 8, 1996 entitled "WAFER SPACING MASK FOR A SUBSTRATE SUPPORT CHUCK AND METHOD OF FABRICATING SAME", and is incorporated herein by reference. An electrostatic chuck of this type is referred to as a Minimal Contact Area (MCA) electrostatic chuck.

To operate the present invention in conjunction with an MCA electrostatic chuck, the surface electrodes of either embodiment (FIGS. 1 or 4) are positioned between the mask pads, e.g., between pads $404_1$, and $404_2$ The mask pads have a height that is taller than the height of the electrode $306_3$ such that when the wafer is fully chucked, the backside of the wafer 214 does not contact the electrode 306₃. By judiciously spacing the mask pads from one another, the wafer spacing mask ensures that the backside 404 of the wafer 202 does not contact the surface 104 of the wafer support pedestal 102 nor the electrode 306₃. However, during chucking, the wafer bows toward the electrode 306₃ such that the gap 406 between the backside 214 of the wafer 202 and the electrode 306₃ varies with chucking force. As such, the capacitance between the wafer 202 and the electrode 306₃ varies with chucking force.

Since the capacitance directly varies in response to chucking force, the invention can be used to indicate excessive chucking force. If the chucking voltage is excessive, the wafer will bow significantly between the support pads, damaging the wafer. Furthermore, as a result of excessive bowing of the wafer, contaminant particle adhesion to the backside 214 of the wafer 202 could increase. Consequently, the capacitance measurement circuit of the present invention detects when the wafer is chucked, as well as indicate the amount of force used to chuck the wafer. Monitoring the chucking force in this manner allows precise control over chucking force by altering chucking voltage in response to the capacitance measurement; thereby, preventing excessive bowing of the wafer and excessive particle adhesion to the backside of the wafer.

Figure 7:
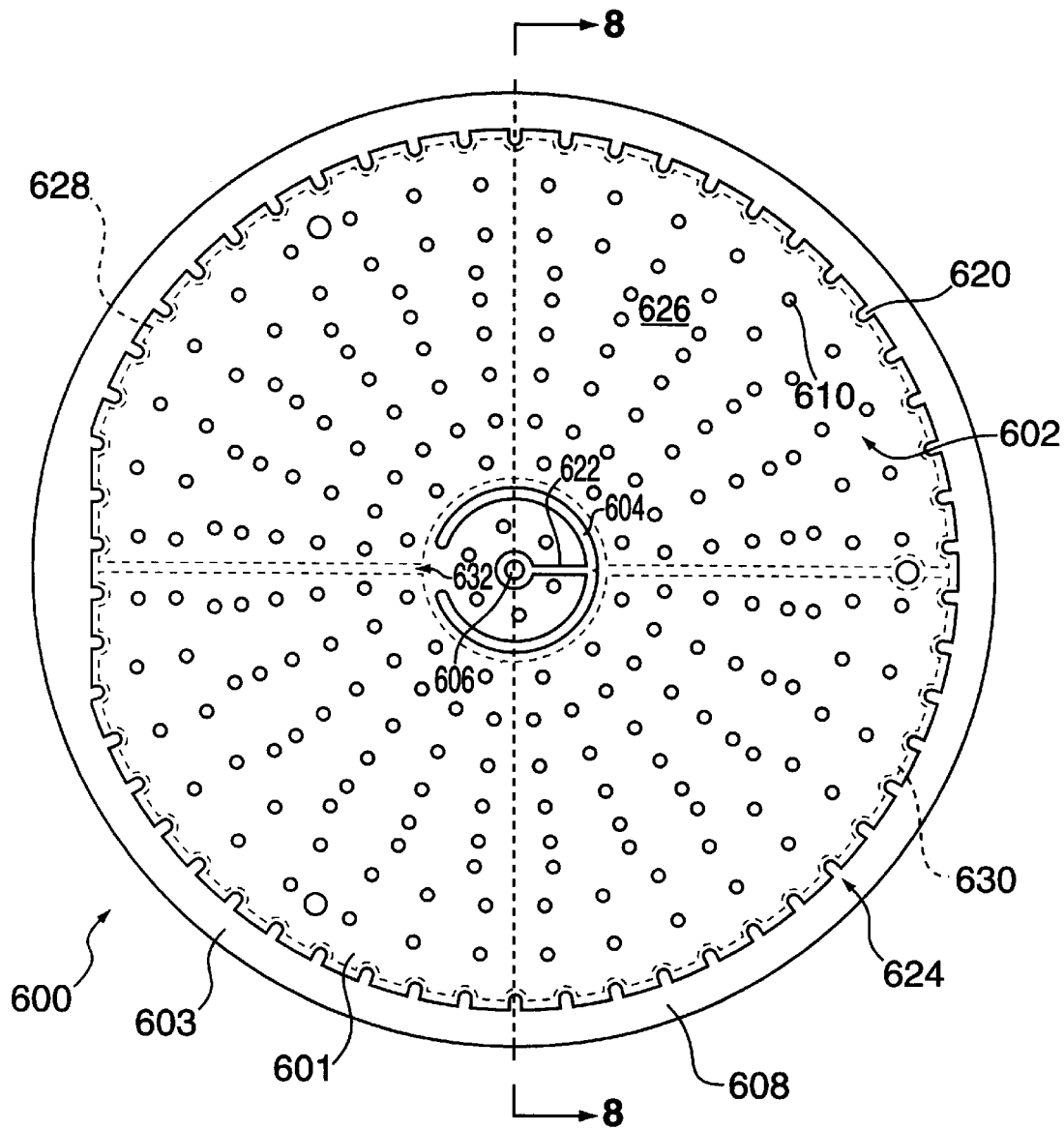
FIG. 7 depicts a top plan view of a third embodiment of the invention including a ceramic electrostatic chuck having a wafer spacing mask.

As a third embodiment of the invention, FIG. 7 depicts a top plan view of a ceramic MCA electrostatic chuck 600 having a wafer spacing mask 602 disposed upon the surface 626 of the chuck 600. FIG. 8 depicts a cross-sectional view taken along line 8—8 of FIG. 7. Specifically, the electrostatic chuck 600 contains a central, wafer support region 601 and a circumferential flange 603 that extends radially from the region 601. As is conventional in an electrostatic chuck, one or more coplanar electrodes (for example, two electrodes 628 and 630) are embedded beneath the surface 626 of the chuck 600. Those skilled in the art could configure any number of electrodes, for example, the electrodes may be monopolar or bipolar, and may have various shapes including circular, D-shape, interdigitated and the like.

Atop the chuck surface 626 are the plurality of pads 610 of the spacing mask 602. These pads 610 maintain the wafer in a spaced-apart relation to the surface 626 of the ceramic chuck 600. The invention includes an inner surface electrode 604 and an outer surface electrode 624. These electrodes function as both wafer detection system electrodes and as pads to support a wafer above the surface of the chuck, i.e., the electrodes 624 and 604 have a height that is equivalent to the height of the mask pads 610.

More specifically, the inner surface electrode 604 is substantially annular having a gap 632 to interrupt its annular shape, i.e., the inner surface electrode is C-shaped. Ideally, the inner surface electrode is annular; however, deposition constraints require a C-shaped electrode. The inner surface electrode 604 is connected, via surface conductor 622, to a conductive gas feed line 606. The gas feed line 606 is generally used to supply a heat transfer medium (e.g., argon or helium gas) to the space between the wafer 202 and the chuck surface 626. The inner electrode has a radius of approximately 0.75 inches (1.9 cm) and a line width of approximately 0.15 inches (0.38 cm).

The outer surface electrode 624 contains a plurality of contact pads 620 (e.g., being fifty-four finger-shaped electrodes, each having a width of approximately 0.125 inches (0.32 cm)) that are connected to one another via an edge conductor 608 that is affixed to the vertical edge 634 of the central region 601 of the chuck 600 and to the top surface 636 of the flange 603. In this manner, the interconnected pads 620 form a single, outer surface electrode 624.

The inner and outer surface electrodes are formed in the same manner as the wafer spacing mask of the MCA electrostatic chuck. Specifically, a stencil is positioned atop the chuck, where the stencil contains apertures that define the mask pads 610 as well as the surface electrodes 604 and 624. A metal such as titanium or titanium-nitride is sputtered over the stencil and the chuck. When the stencil is removed, the electrodes and the wafer support mask remain on the chuck surface.

Although a preferred arrangement of electrodes is described, any arrangement of surface electrodes that facilitates capacitance measurements are considered within the scope of the invention.

FIG. 8 depicts a cross-sectional view of the MCA electrostatic chuck 600 of FIG. 7 having the capacitance measuring circuit 110 connected between the inner and outer surface electrode 604 and 624. When a wafer is positioned atop the chuck and "chucked" by applying a chucking voltage to embedded chuck electrodes 628 and 630, the wafer contacts both the outer and inner surface electrodes 604 and 624.

The capacitance between the inner and outer surface electrodes 604, 624 is measured in the same manner as discussed above using the capacitance measurement circuit 110, e.g., the electrodes and the wafer form a capacitive tuning element for the circuit 110. If the wafer is not centered, broken, or improperly chucked, the capacitance measurement will not fall within a pre-defined capacitance and a system operator can take appropriate action to correct the problem.

As depicted in FIG. 3 and discussed above, the wafer 202 forms a conductor such that if the wafer is not centered or damaged, i.e., cracked or broken in some manner, the conductive path between the electrodes is interrupted, e.g., the path between electrode 624 and electrode 604, the capacitance measurement will be incorrect, e.g., very low.

Furthermore, FIG. 9 depicts a cross-sectional view taken along line 8—8 of FIG. 7 of the present invention used in conjunction with an MCA electrostatic chuck 600. In this embodiment of the invention, each embedded electrode 628 and 630 is connected to the capacitance measurement circuit 110. Specifically, electrode 628 is AC coupled through capacitors 638 and electrode 640 is AC coupled through capacitor 640. The output of each of the capacitors 638 and 640 are connected to a common node 642. As such, to the AC circuit of the capacitance measurement circuit 110, the embedded electrode pair forms a single measurement electrode. Of course, if the chuck is a monopolar chuck, a single embedded electrode is used and the circuit 110 is coupled through a single capacitor to the electrode. Furthermore, to facilitate wafer chucking, a separate chucking voltage supply 644, e.g., a DC voltage source, is separately coupled to the embedded electrodes.

Additionally, the capacitance measurement circuit 110 is also coupled to both the inner and outer surface electrodes 604 and 624. Specifically, one input 112₁ to the capacitive circuit 110 is coupled to the outer surface electrode 624 and the embedded electrodes 628 and 630, while a second input 112₂ is coupled to the inner surface electrode 604 and the embedded electrodes 628 and 630. The capacitance between the inner surface electrode and the embedded electrodes as well as the capacitance between the outer surface electrode and the embedded electrodes are measured in the same manner as discussed above. Specifically, the inner surface electrode 604 in combination with the embedded electrodes 628 and 630 form a capacitive tuning element for an oscillator of the measuring circuit 110 such that the frequency of the output of the oscillator will change with the capacitance across the input terminals $112_1$. A second circuit can be provided for measuring the capacitance between the outer surface electrode 624 and the embedded electrodes 628 and 630, or the signals from each pair of electrodes can be multiplexed into single measurement circuit 110. In either case, the frequency of the oscillator is converted to a DC voltage that is indicative of the capacitance between each respective surface electrode 604 and 624 and the embedded electrodes. Of course, as with the other embodiments of the invention, any form of capacitance measuring circuit is considered to be within the scope of the invention. Generally speaking, for a "bare" silicon wafer, the capacitance changes approximately 1000 pF when a wafer is positioned upon the electrostatic chuck as compared to the capacitance measured when no wafer is positioned on the chuck. For an oxide wafer, the capacitance changes by approximately 100 pF.

In addition to detecting wafer presence, chuck condition, and wafer alignment, the inventive apparatus can also be used to determine the direction of wafer warping (e.g., positive or negative bow) and the minimum chucking voltage necessary to chuck a warped wafer. For example, FIG. 9 depicts a wafer 202A (in phantom) having a negative bow. Prior to chucking, this wafer 202A contacts the inner surface electrode 604 and not the outer surface electrode 624. As such, the capacitance measured between the inner surface electrode and the embedded electrodes 628 and 630 is substantially higher than the capacitance measured between the outer surface electrode 624 and the embedded electrodes 628 and 630. Consequently, the circuit 110 detects that the wafer 202A has a negative bow. Similarly, for a positive bow, the outer surface electrode contacts the wafer and the inner surface electrode does not.

Once a wafer is determined to have a bow, the chucking voltage applied to the embedded electrodes 628 and 630 is incrementally increased until the wafer contacts both the inner and outer surface electrodes 604 and 624. At that point, the wafer is chucked. Consequently, the electrostatic chuck does not apply excessive chucking force to the wafer.

To enhance the resolution of the capacitance measurement, the parasitic capacitance between the inner and outer electrodes and the embedded electrodes should be minimized. As such, the surface electrodes 604 and 624 should not overhang the embedded electrodes 628 and 630. Thus, the embedded electrodes 628 and 630 are patterned (as shown in phantom in FIG. 7) to avoid any overlap by the surface electrodes 604 and 624. Specifically, the outer edge of the embedded electrodes are patterned (scalloped) to avoid extending beneath the finger-shaped portions of the surface electrode 624. Additionally, the inner edges of the embedded electrodes 628 and 630 are patterned to avoid extending beneath the inner surface electrode 604, e.g., the inner edges of the embedded electrodes have a slightly larger diameter than the outer diameter of the inner surface electrode.

However, empirical study has indicated that eliminating the overlap of the embedded and surface electrodes may expose the surface electrodes to other sources of parasitic capacitance. In other words, the embedded electrodes may operate as a shield with respect to the surface electrodes. Consequently, the choice of whether to overlap the electrodes or not depends upon the operating conditions of the electrostatic chuck and its surrounding components, i.e., neighboring sources of parasitic capacitance. The electrode design can be optimized with these constraints in mind such that the surface and embedded electrodes overlap, the inner surface electrode overlaps the embedded electrodes and the outer surface electrode does not overlap the embedded electrode or vice versa, or the surface and embedded electrodes do not overlap. Consequently, the electrode arrangement is a design choice tailored by the application of the chuck.

Although various embodiments which incorporate the teachings of the present invention have been shown and described in detailed herein, those skilled in the art can readily devise many other varied embodiments that still incorporate these teachings.

What is claimed is:

1. A wafer detector for detecting the presence of a wafer on a semiconductor wafer support pedestal comprising:
    a plurality of surface electrodes on a surface of said wafer support pedestal, said plurality of surface electrodes positioned about a circumference of said surface; and
    a capacitance measuring circuit coupled to at least one surface electrode in said plurality of surface electrodes.

2. The wafer detector of claim 1 further comprising:
    an embedded electrode disposed beneath said surface of said wafer support pedestal, where said capacitance measuring circuit is coupled to said embedded electrode for measuring a capacitance between the surface electrodes and the embedded electrode.

3. The wafer detector of claim 1 wherein said plurality of surface electrodes on said wafer support pedestal is positioned equilaterally about a circumference of said surface.

4. The wafer detector of claim 3 wherein each surface electrode in said plurality of surface electrodes is paired with another surface electrode, forming a plurality of surface electrode pairs positioned equilaterally about said circumference of said surface, said capacitance measuring circuit measuring the capacitance between each surface electrode pair.

5. The wafer detector of claim 3 wherein said plurality of surface electrodes further comprises a common surface electrode positioned in a center of said surface, said capacitance measuring circuit measuring a capacitance between said common surface electrode and each surface electrode in said plurality of surface electrodes.

6. The wafer detector of claim 5 wherein the common surface electrode is coupled to a gas feed line in said wafer support pedestal.

7. The wafer detector of claim 2 wherein said wafer is clamped to said surface by an electrostatic force between said embedded electrode and said wafer.

8. A wafer detector for detecting the presence of a wafer on a semiconductor wafer support pedestal comprising:
    a plurality of surface electrodes on a surface of said wafer support pedestal;
    a wafer spacing mask disposed on said surface; and
    a capacitance measuring circuit coupled to at least one surface electrode in said plurality of surface electrodes.

9. The wafer detector of claim 8 wherein said wafer spacing mask further comprises a plurality of mask pads on said surface.

10. The wafer detector of claim 9 wherein said plurality of surface electrodes are positioned between said plurality of mask pads.

11. The wafer detector of claim 1 wherein said plurality of surface electrodes further comprises an inner surface electrode and an outer surface electrode, where said capacitance measuring circuit is coupled to said inner surface electrode and said outer surface electrode.

12. The wafer detector of claim 11 wherein said inner and outer surface electrodes support said wafer above the surface of the wafer support pedestal.

13. The wafer detector of claim 9 wherein said capacitance measuring circuit is coupled to a gas feed line and said inner surface electrode is coupled to said gas feed line.

14. The wafer detector of claim 9 further comprising:

an embedded electrode beneath the surface of said wafer support pedestal;

an outer surface electrode disposed upon the surface of said wafer support pedestal proximate a circumferential edge of said surface;

an inner surface electrode disposed upon the surface of said wafer support pedestal proximate a center of said surface; and said capacitance measuring circuit, coupled to said embedded electrode , said inner surface electrode, and said outer surface electrode.

15. The wafer detector of claim 9 wherein said mask pads and said surface electrodes have equivalent heights.

* * * * *